(12) United States Patent
Adler et al.

(10) Patent No.: US 6,979,824 B1
(45) Date of Patent: Dec. 27, 2005

(54) FILTERED E-BEAM INSPECTION AND REVIEW

(75) Inventors: David L. Adler, San Jose, CA (US); Luca Grella, Gilroy, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/886,519

(22) Filed: Jul. 7, 2004

Related U.S. Application Data

(63) Continuation of application No. 10/607,224, filed on Jun. 26, 2003, now Pat. No. 6,797,955.

(51) Int. Cl.[7] .............................................. H01J 37/14

(52) U.S. Cl. ..................................................... 250/310

(58) Field of Search ........................................ 250/310

(56) References Cited

U.S. PATENT DOCUMENTS

| | | | |
|---|---|---|---|
| 6,038,018 A | * | 3/2000 | Yamazaki et al. ........ 356/237.1 |
| 6,232,787 B1 | * | 5/2001 | Lo et al. ...................... 324/751 |
| 6,317,514 B1 | * | 11/2001 | Reinhorn et al. ........... 382/147 |
| 6,583,414 B2 | * | 6/2003 | Nozoe et al. ................ 250/310 |

* cited by examiner

*Primary Examiner*—Nikita Wells
*Assistant Examiner*—James J. Leybourne
(74) *Attorney, Agent, or Firm*—Okamoto & Benedicto LLP

(57) ABSTRACT

The disclosure relates to filtered e-beam inspection and review. One embodiment pertains to the filtered inspection or review of a specimen with a high aspect ratio feature. Advantageously, the energy and/or angular filtering improves the information retrievable relating to the high aspect ratio feature on the specimen. Another embodiment pertains to a method for energy-filtered electron beam inspection where a band-pass energy filtered image data is generated by determining the difference between a first high-pass energy-filtered image data set and a second high-pass energy-filtered image data set.

25 Claims, 20 Drawing Sheets

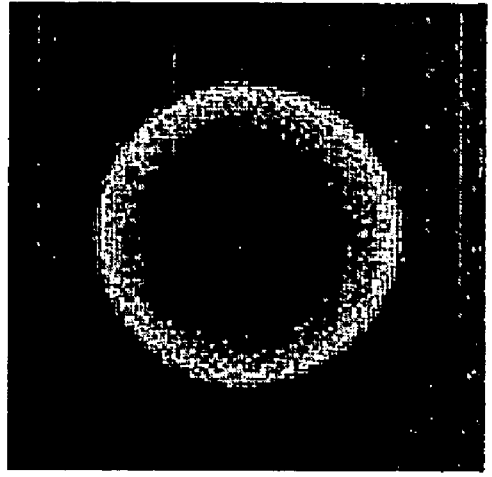
blocked via
404
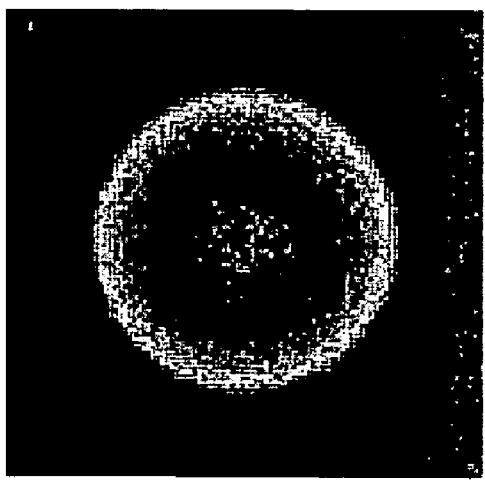
open via
402
Unfiltered
FIG. 4

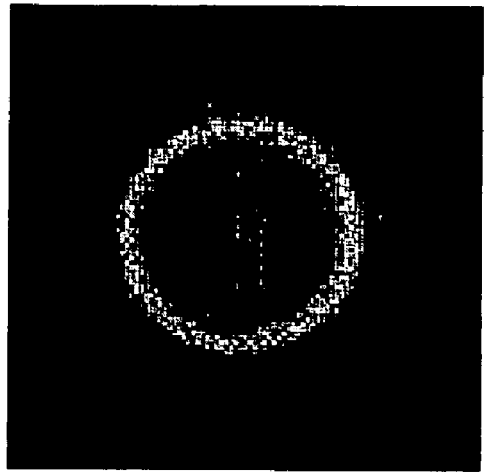
blocked via
504
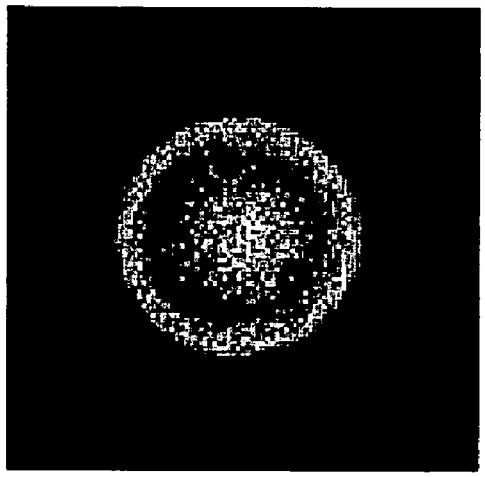
open via
502
Energy Filtered
FIG. 5

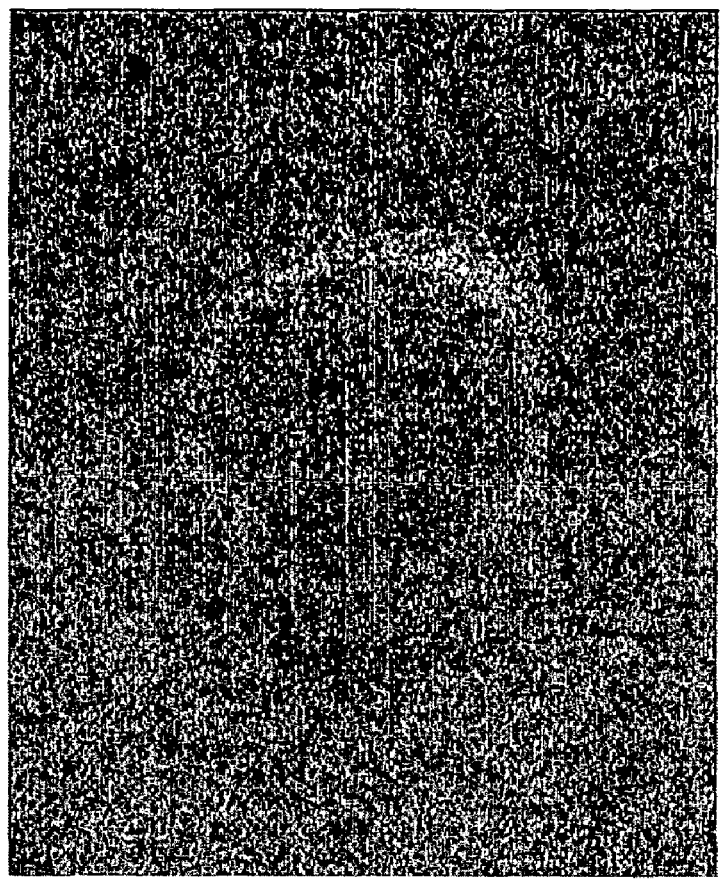
Experiment
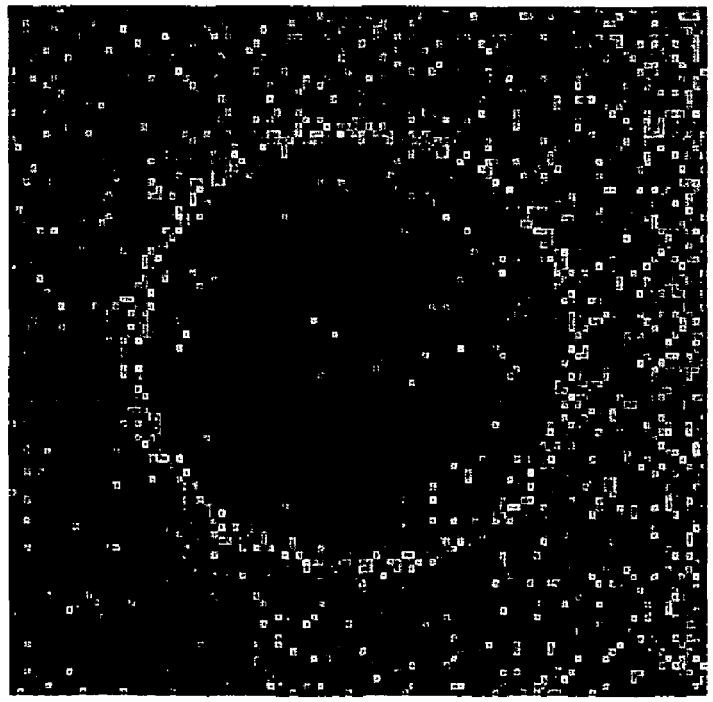
Simulation
FIG. 14

1800

FILTERED E-BEAM INSPECTION AND REVIEW

CROSS-REFERENCE TO RELATED APPLICATIONS

The present application is a continuation of U.S. patent application Ser. No. 10/607,224, filed Jun. 26, 2003, now U.S. Pat. No. 6,797,955, entitled "Filtered E-Beam Inspection and Review," by inventors David L. Adler, Luca Grella, and Gabor D. Toth, which is hereby incorporated by reference in its entirety.

BACKGROUND OF THE INVENTION

1. Field of the Invention

The present invention relates generally to specimen inspection and review. More particularly, the present invention relates to e-beam inspection and systems.

2. Description of the Background Art

Automated inspection and review systems are important in process control and yield management for the semiconductor and related microelectronics industries. Such systems include optical and electron beam (e-beam) based systems.

An example of an e-beam apparatus for an inspection or review system is described in U.S. Pat. No. 5,578,821*, issued to Meisberger et al (the Meisberger patent). The disclosure of the Meisberger patent is hereby incorporated by reference in its entirety. FIG. 1 (corresponding to FIG. 5 in the Meisberger patent) is a simplified schematic representation of the paths of the primary, secondary, back-scatter and transmitted electrons through the electron column and collection system for electron beam inspection. In brief, FIG. 1 shows a schematic diagram of the various electron beam paths within the column and below substrate 57. Electrons are emitted radially from field emission cathode 81 and appear to originate from a very small bright point source. Under the combined action of the accelerating field and condenser lens magnetic field, the beam is collimated into a parallel beam. Gun anode aperture 87 masks off electrons emitted at unusable angles, while the remaining beam continues on to beam limiting aperture 99. An upper deflector (not depicted) is used for stigmation and alignment, ensuring that the final beam is round and that it passes through the center of the objective lens 104 comprising elements 105, 106 and 107. A condenser lens (not depicted) is mechanically centered to the axis defined by cathode 81 and beam limiting aperture 99. The deflection follows the path shown, so that the scanned, focused probe (beam at point of impact with the substrate) emerges from the objective lens 104. In High Voltage mode operation, Wien filter deflectors 112 and 113 deflect the secondary electron beam into the secondary electron detector 117. When partially transparent masks are imaged, the transmitted beam 108 passes through electrode system 123 and 124 that spreads the beam 108 before it hits the detector 129. In Low Voltage mode operation, the secondary electron beam is directed by stronger Wien filter deflections toward the low-voltage secondary electron detector 160 that may be the same detector used for backscatter imaging at high voltage. Further detail on the system and its operation is described in the Meisberger patent.

There are also other types of e-beam tools for inspection or review. For instance, another type is described in U.S. Pat. No. 5,973,323, issued to Adler et al (the Adler patent). The disclosure of the Adler patent is hereby incorporated by reference in its entirety. The Adler patent discloses a Secondary Electron Emission Microscope (SEEM). The SEEM is an example of a projection type system, where the e-beam impinges upon a relatively large region, and scattered electrons from the region are imaged onto a two-dimensional detector.

BRIEF DESCRIPTION OF THE DRAWINGS

FIG. 4 presents simulated e-beam image data from an open via and a blocked via using conventional e-beam technology.

FIG. 5 simulated e-beam image data from an open via and a blocked via with filtering in accordance with an embodiment of the invention.

FIG. 14 shows simulated and experimentally measured images of a high aspect ratio feature in accordance with an embodiment of the invention.

SUMMARY

Figure 1:
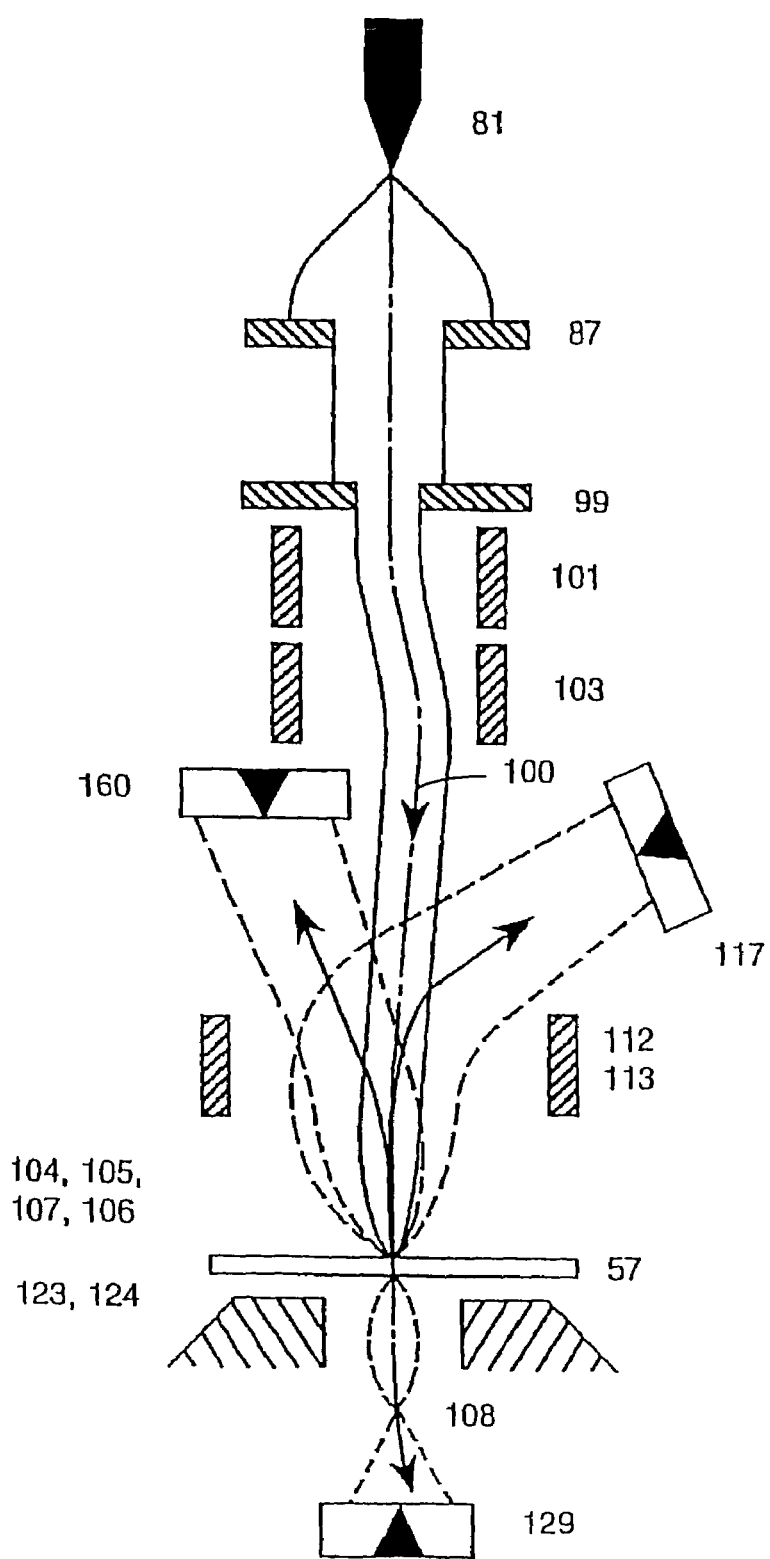
FIG. 1 illustrates an example of an electron beam (e-beam) tool for an inspection or review system.

The present invention relates to methods and apparatus for inspection or review of specimens. One method in accordance with an embodiment of the invention includes impinging a primary beam onto an area of the specimen that includes the high aspect ratio feature, extracting scattered electrons that are generated due to the impingement of the primary beam onto the specimen, applying a filter to remove the scattered electrons with characteristics outside of a selected filter range, and detecting the scattered electrons with characteristics inside of the selected filter range to generate image data relating to the high aspect ratio feature. Advantageously, the filtering improves the information retrievable relating to the high aspect ratio feature on the specimen.

One apparatus in accordance with an embodiment of the invention includes a source and lenses for impinging a primary beam onto an area of the specimen, an extraction mechanism for extracting scattered electrons that are generated due to the impingement of the primary beam onto the specimen, a filter for filtering out the scattered electrons with energies outside of a selected energy range, a detector for detecting the scattered electrons with energies inside of the selected energy range to generate image data relating to the area of the specimen; and a computing device for processing the image data in relation to the high aspect ratio features.

Another method in accordance with an embodiment of the invention includes capturing first and second image data sets including electrons with energies above first and second threshold energy levels, respectively, and generating bandpass energy filtered image data by subtracting one said image data set from the other said image data set.

Another apparatus in accordance with an embodiment of the invention includes the following: a voltage generating system configured to generate a first voltage level and a second voltage level and to output in an alternating fashion the first and second voltage levels at a frame capture frequency; an electron detector configured to detect a first image data set of electrons with energies above a first threshold energy level in response to the first voltage level and to detect a second image data set of electrons above a second threshold energy level in response to the second voltage level; a first memory buffer region configured to store the first image data set; a second memory buffer region configured to store the second image data set; and a bandpass image generator configured to generate a band-pass image data set by subtraction of the second image data set from the first image data set.

DETAILED DESCRIPTION

Semiconductors have various features, some of which have high aspect ratios. High aspect ratio features are features with height substantially greater than width. For example, if a feature is 0.20 microns wide and 0.40 microns deep, then it would have an aspect ratio of two. As another example, if a feature is 0.1 microns wide and 0.5 microns deep, then it would have an aspect ratio of five. Typically, the higher the aspect ratio of the feature, the more difficult it is to characterize using existing tools.

Figure 2:
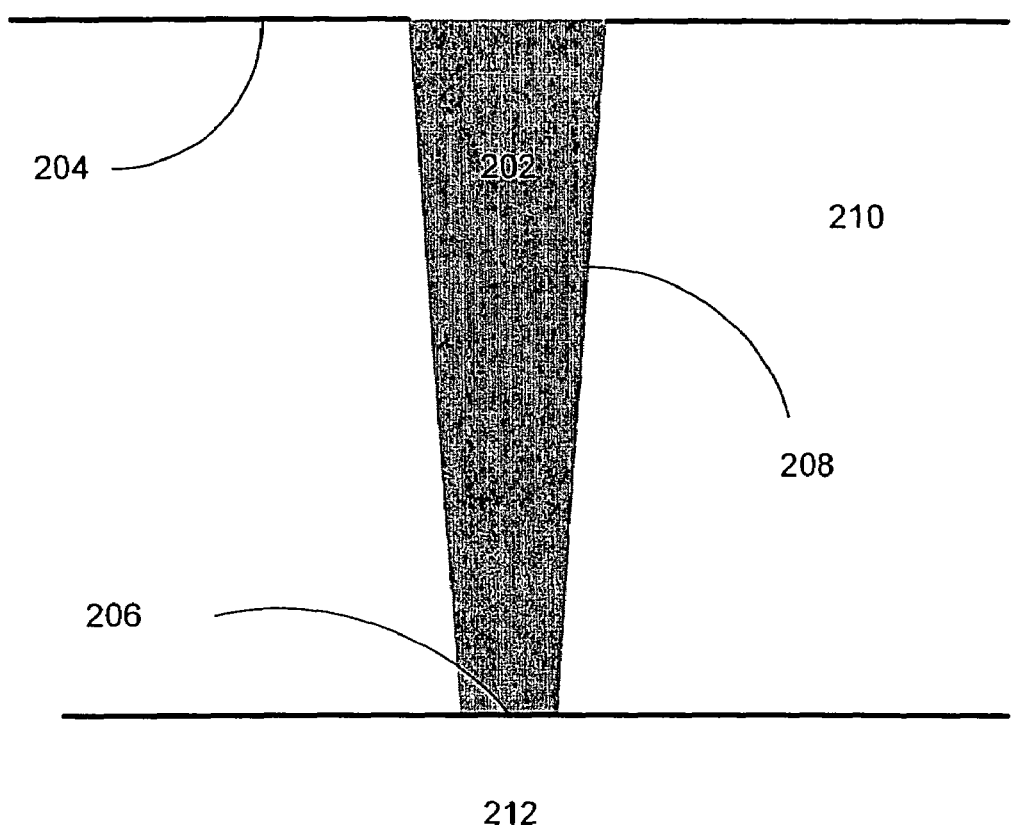
FIG. 2 illustrates an example of a high aspect ratio feature (an open via).

FIG. 2 illustrates an example high aspect ratio (HAR) feature 200. The HAR feature 200 may comprise, for example, a via 202 through one or more layers of a semiconductor structure. Such vias 202 are commonly formed during the manufacture of integrated circuits and are generally filled with conductive material in a subsequent manufacturing step. The via 202 is an opening in a top surface 204. The opening extends to a bottom 206. The sidewalls 208 of the via separate the opening 202 from the material of the first layer 210 through which the via extends. The first layer 210 may comprise an insulating material such as, for example, an oxide. The second layer 212 at the bottom 206 of the via 202 may comprise of a conducting material, such as, for example, polysilicon.

Figure 3:
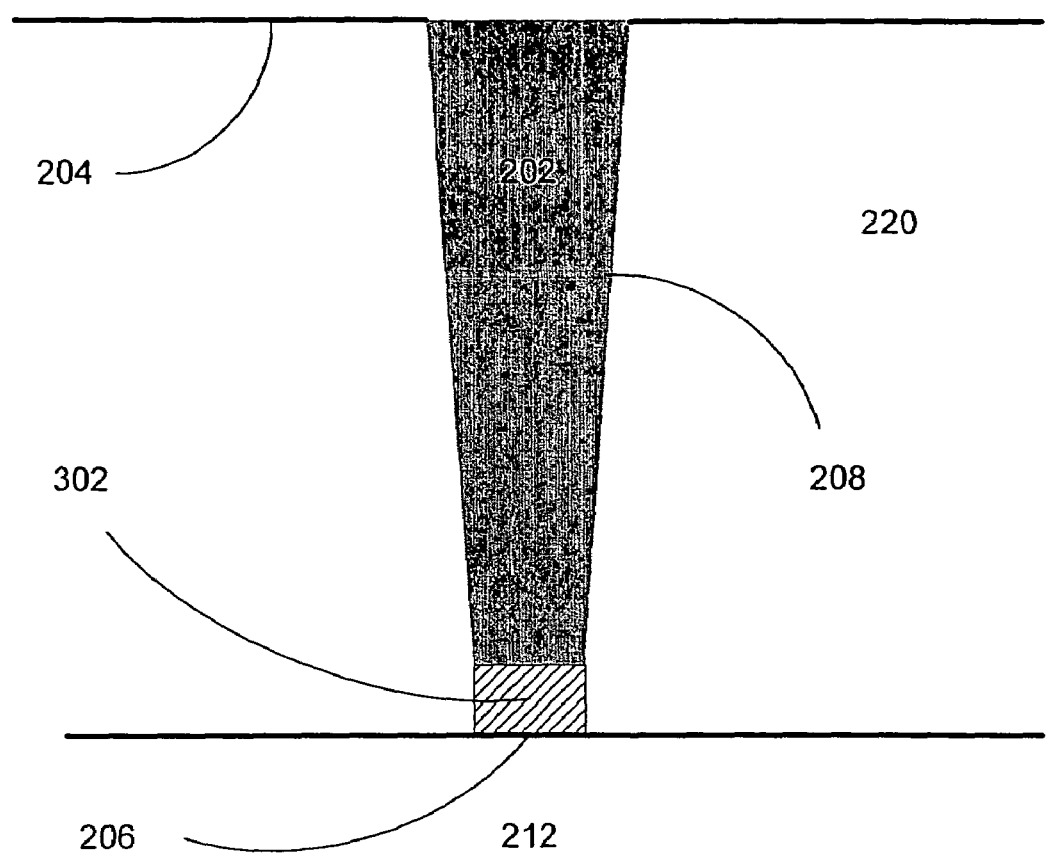
FIG. 3 depicts a blocked via for purposes of illustration.

Unfortunately, the inside of high aspect ratio features is often obscured in image data from e-beam tools. For example, consider the via of FIG. 3 in contrast to the via of FIG. 2. The via 202 in FIG. 2 is an open via in that it is a clean opening through to the layer 212 beneath. On the other hand, the via 202 in FIG. 3 is a blocked via in that it is not a clean opening through to the layer 212 beneath. Instead, undesired material 302 is near the bottom of the via 202 in FIG. 3. For instance, the undesired material 302 may comprise an insulator (such as an oxide or other non-conductive material) that, after the via 202 is filled with a conductor, would block electrical contact to the layer 212 beneath.

FIG. 4 presents simulated e-beam image data from a "good" via and a "bad" via using conventional e-beam technology. The good (clean or open) via produces an image 402 such as that shown on the left. The bad (contaminated or blocked) via produces an image 404 such as that shown on the right. Note that the difference between the two images are not particularly great. Both images show an intensity ring from the large amount of scattered electrons being extracted from the walls of the vias. Distinguishing between the two in a definitive manner may be problematic, especially for automated e-beam inspection or review systems. Disadvantageously, this makes it difficult for an e-beam inspection system to detect "bad" vias and difficult for an e-beam review system to further characterize the vias.

The foregoing discussion shows how proper examination of high aspect ratio features is problematic with conventional e-beam inspection and review technology. Hence, improvement of e-beam inspection and review systems is desirable in order to better characterize high aspect ratio features on semiconductors and other specimens.

In one embodiment of the invention, the below-described filtering technique is advantageously applied in an inspection tool for detection of defects relating to high aspect ratio features in wafers being manufactured. The inspection tool may have a continuously moving stage such that the wafers are continuously passed under the inspection tool. With such a continuously moving stage, the wafers may be advantageously scanned for the high-aspect-ratio-feature defects where the scanning is performed in-line with high throughput.

In another embodiment of the invention, the below-described filtering technique is advantageously applied in a review tool for classification of the high-aspect-ratio-feature defects found in wafers being manufactured. In a specific embodiment, the review tool with filter may comprise a multi-perspective review tool.

In another embodiment, the filtering technique may be applied in a critical dimension scanning electron microscope (CD SEM) to measure the dimensions of contact bottoms. Advantageously, the filtering may improve resolution of critical dimension and similar measurements.

FIG. 5 depicts two simulated e-beam images with filtering in accordance with an embodiment of the invention. The image 502 on the left is from an open or clean via like the one depicted in FIG. 1. The image 504 on the right is from a blocked or contaminated via like the one depicted in FIG. 3. The images were generated assuming an energy filtering that excluded scattered electrons with energies lower than a threshold energy. In other words, the image data includes only scattered electrons with energies above the threshold energy. In contrast to the two images in FIG. 4, the two images in FIG. 5 are substantially easier to distinguish. In particular, the image 502 from the open via has substantial intensity visible from the bottom of the via that is not present from the image 504 of the blocked via. Unlike the conventional images 402 and 404 of FIG. 4, the images 502 and 504 in accordance with the invention are overwhelmed by the intensity ring due to the wall of the vias. Hence, distinguishing between the open and blocked vias in a definitive manner is greatly facilitated, especially for automated e-beam inspection or review systems. Advantageously, this enables an e-beam inspection system to detect "bad" vias and enables an e-beam review system to further characterize the vias.

In accordance with embodiments of the invention, such filtering of scattered electrons (including secondary electrons and/or backscattered electrons) may be a feature included in an e-beam inspection or review tool. The filtering may comprise energy filtering and/or filtering. The energy filtering may be implemented, for example, using a negatively biased electrostatic grid in front of the detection system. Another implementation would use an omega (magnetic) filter, instead of the electrostatic grid. Yet another implementation would instead use a Wien filter. The angular filtering may be implemented, for example, using one or more apertures in the pupil plane of the system to filter out electrons that are not leaving the specimen at a perpendicular angle to the surface. Such an angular filter may be used to favorably select electrons coming from the bottom of high aspect ratio features because those electrons are going relatively straight up out of the feature.

In accordance with another embodiment of the invention, the energy filtering may be applied in a Photo-Emission Electron Microscopy (PEEM) system. A PEEM system uses incident light (photons), instead of a primary electron beam, to excite electrons that are detected in order to generate image data of a region. The invention may also have use in relation to a Low Energy Electron Microscope (LEEM).

Figure 6:
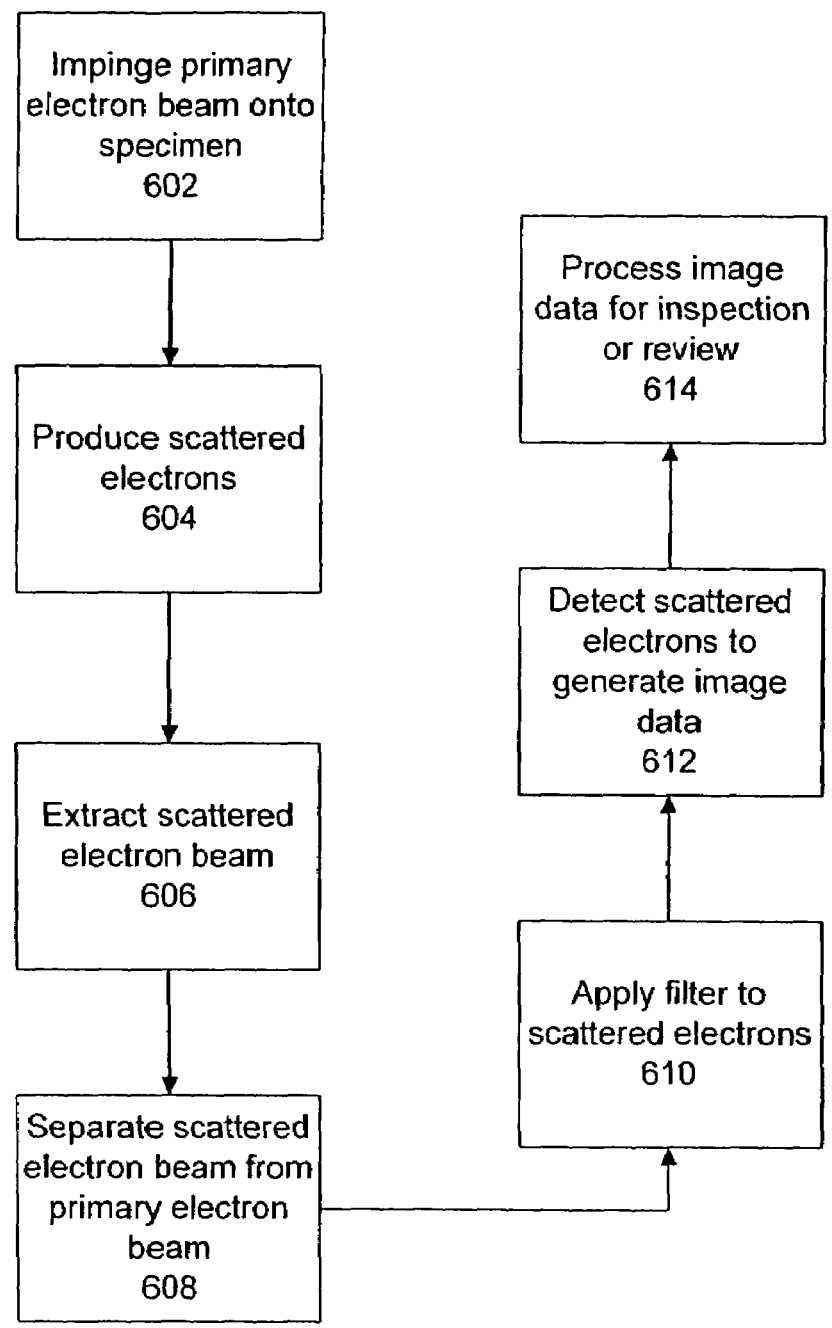
FIG. 6 is a flow chart depicting a method for using an electron beam to examine a specimen with a high aspect ratio feature in accordance with an embodiment of the invention.

FIG. 6 is a flow chart depicting a method for using an electron beam to examine a specimen with a high aspect ratio feature in accordance with an embodiment of the invention. The method 600 as depicted includes seven steps (602, 604, 606, 608, 610, 612, and 614). While the method 600 described relates specifically to an e-beam embodiment of the invention, a similar method is applicable in other embodiments, such as those in a PEEM system.

In the first step 602, a primary electron beam is impinged onto the specimen. The primary electron beam may be generated, for example, by an electron source (for example, electron gun source 81 in FIG. 1) and focused by various electron lenses (for example, condenser and objective lenses) onto a region of the specimen. The primary electron beam may be scanned over the specimen, or alternately the parallel imaging (non-scanning) with a broader beam may be used. In another embodiment, instead of a primary electron beam, a beam of photons may be used if the system is a PEEM system. In particular, the incident beam (whether electrons or photons) may be impinged onto a region of the specimen with a high aspect ratio feature, such as a via.

In the second step 604, scattered electrons (secondary electrons and/or backscattered electrons) are produced from the illuminated region of the specimen. For example, inelastic scattering of the primary electrons transfers energy to the secondary electrons such that they escape the surface of the specimen. The primary electrons may also be elastically scattered to produce backscattered electrons. Alternatively, in a PEEM system, the inelastic scattering of the incident photons generates the secondary electrons from the illuminated region. Where a feature being illuminated comprises a via, secondary electrons are generated from the surrounding surface 204 near the via 202, from the sidewalls 208 of the via, and from the bottom 206 (or 302) of the via 202.

In the third step 606, the scattered electrons are extracted to form the scattered electron beam. An extracting electrode that is positively biased may be used in extracting the scattered electrons from near the surface of the specimen. The scattered electrons typically pass through an objective lens (for example, objective lens 104 in FIG. 1) in the opposite direction as the primary electron beam.

In the fourth step 608, the scattered electron beam is separated from the primary electron beam. A beam separator, such as the Wien filter deflectors 112 and 113 depicted in FIG. 1, may accomplish this function.

In the fifth step 610, energy filtering is applied to the scattered electron beam. The filtering device may be located in the path of the scattered electron beam and before the scattered electron beam reaches the detecting device. For example, the filtering device may be located along the beam path prior to the electron detector 160 in FIG. 1 The filtering device may comprise, for example, an energy filter implemented as a negatively biased electrostatic grid, an omega (magnetic) filter, or a Wien filter. The energy filter would prevent electrons outside a controlled energy range from reaching the detector. For example, electrons with energies below a threshold energy may be prevented by the filter from reaching the detector. As discussed above in relation to FIG. 5, this filtering step advantageously facilitates an inspection or review system in examining a high aspect ratio feature in the region being illuminated.

In the sixth step 612, the scattered electrons are detected and image data is generated from the detection data. The detecting device may comprise, for example, the electron detector 160 depicted in FIG. 1.

Finally, in the seventh step 614, the image data is processed for inspection or review. The processing would be implemented in an automated tool with a computing device and image processing software. Advantageously, in accordance with an embodiment of the invention, the processing may distinguish between an open via and a blocked via so that the blocked vias may be detected or characterized. Similarly, other high aspect ratio features, such as grooves or channels, may be advantageously inspected or reviewed.

In one embodiment, the processing may involve comparing a semiconductor die being inspected to data from a neighboring or reference die. For example, the energy or flux of electrons detected may be compared between the die under inspection and the reference die. This may be utilized, for example, in a review tool for advanced process inspection. In addition, the locations and other information regarding the defects identified may be recorded in a database. Rule-based techniques may then be advantageously applied to classify the defects.

Prior to the first step 602 described above, an additional pre-charging step may be optionally added. The pre-charging step comprises exposing the region of interest to an incident beam in order to positively charge the upper surface and to negatively charge the sidewalls of high aspect ratio features. The charging of a high aspect ratio feature is further described below in relation to FIG. 11.

Another technique for advantageously enhancing the positive charging of the upper surface may be to illuminate the region of interest with light of sufficiently short wavelength so as to induce the photo-emission of electrons. The wavelength of light may be selected such that the material is advantageously opaque at that wavelength. Optionally, the light may be incident at an angle to advantageously avoid illuminating the bottoms of the high aspect ratio features. Yet another technique for charge control is to apply a second electron beam to the region of interest. For example, a flood gun may be used to advantageously control the surface charging.

Figure 7:
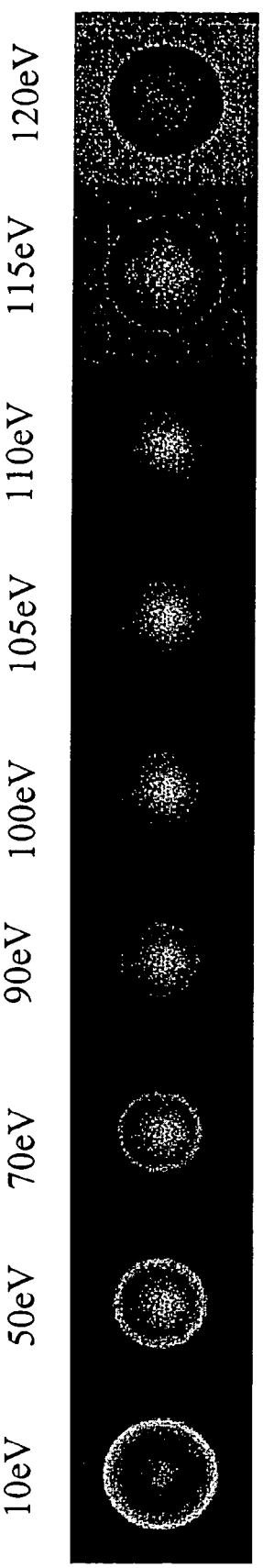
FIG. 7 presents a series of simulated e-beam images of an open (clear or clean) via under various energy filtering thresholds in accordance with an embodiment of the invention.

FIG. 7 presents a series of simulated e-beam images of an open (clear or clean) via under various energy filtering thresholds in accordance with an embodiment of the invention. The text above each image indicates the energy threshold (referenced to beam energy) below which electrons were filtered out. For example, the first image on the left was obtained by keeping only scattered electrons with energies more than 10 electron volts (eV) above the beam energy, where the beam energy is an average or typical energy of electrons in the scattered electron beam. The second image from the left was obtained by keeping only scattered electrons with energies more than 50 electron volts (eV) above the beam energy. And so on. Finally, the rightmost was obtained by keeping only scattered electrons with energies more than 120 electron volts (eV) above the beam energy.

The simulation depicted in FIG. 7 assumed an electrical potential differential between the bottom 206 of the via 202 and the top surface 204 surrounding the via 202 of one hundred volts (100 V). Note that the selection of one hundred volts is arbitrary and that the actual potential difference will depend on the particular feature being examined and the tool being used. For example, the potential difference may be 10 volts, 20 volts, or 50 volts. Since electrons are the particles of interest, the electrical potential differential corresponds to a potential energy differential of one hundred electron volts (100 eV). The electrical potential differential is believed to be caused primarily by the positive charging due to emission of secondary electrons from the top surface 204 of the via 202. The electrical potential difference is described further below in relation to FIGS. 11 and 12.

As shown by the images in FIG. 7, as the threshold energy (relative to the beam energy) approaches the potential energy differential, scattered electrons from the bottom 206 of the via 202 become more prominent and easier to see in the image data. For example, when the threshold energy is at 100 eV, 105 eV, 110 eV, or 115 eV, then it appears that the majority of the electrons detected from the region of the feature are coming from the bottom of the "good" feature.

Figure 8:
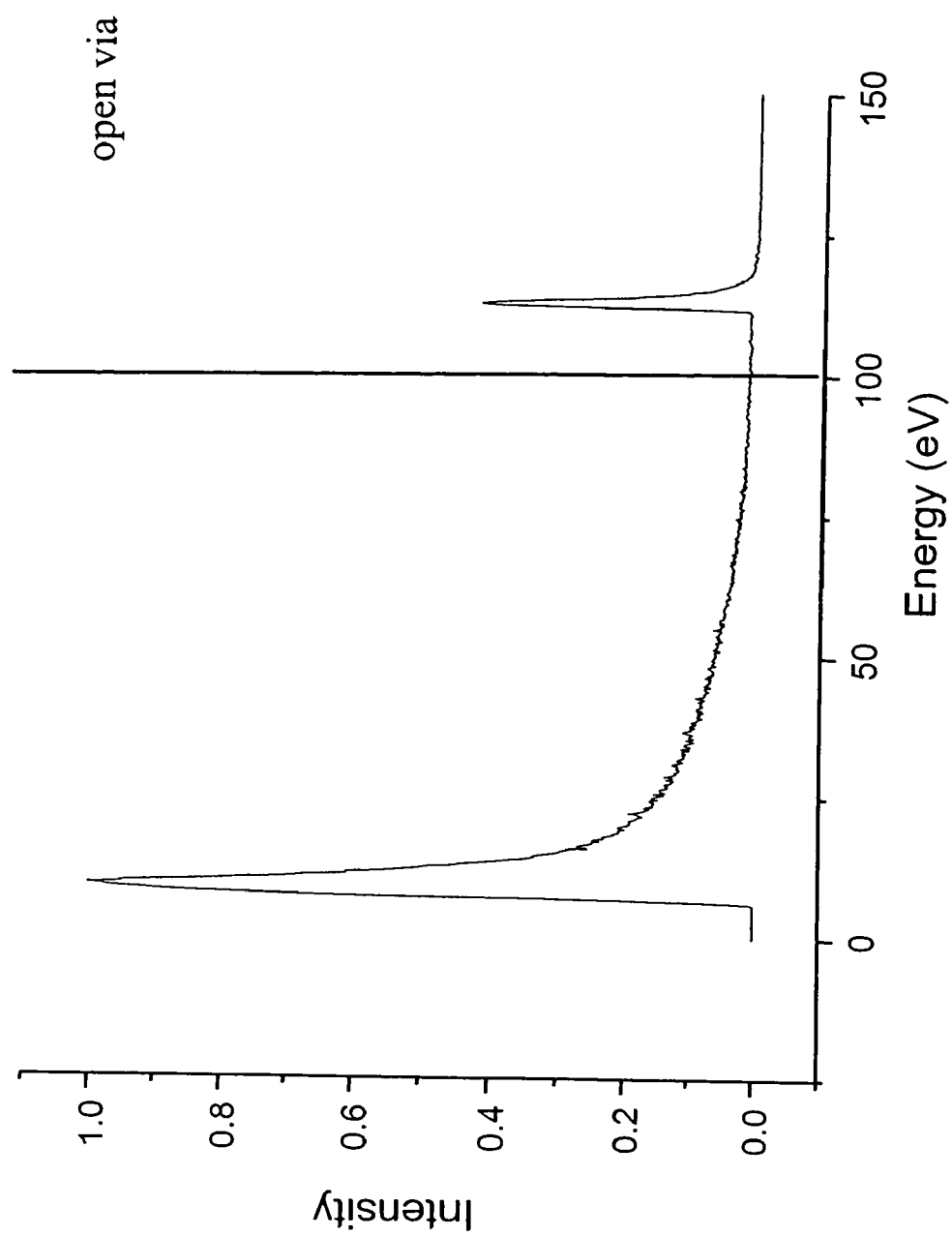
FIG. 8 is a graph depicting the simulated energy spectrum of scattered electrons from an open via in accordance with an embodiment of the invention.

FIG. 8 is a graph depicting the simulated energy spectrum of scattered electrons from an open via in accordance with an embodiment of the invention. A normalized intensity of the scattered electrons is shown at various energies relative to the beam energy. The higher peak on the left near zero electron volts (0 eV) is attributed primarily to secondary electrons being emitted from the top surface 204. The lower peak on the right above one hundred electron volts (100 eV) is attributed primarily to secondary electrons being emitted from the bottom 206 of the clean via 202. The vertical line at 100 eV is indicative of the assumed potential energy differential of 100 eV from top to bottom of the via. As shown in FIG. 8, with an energy filtering threshold of around 110 eV, the electrons with energies to the left of the second peak become filtered out, but the electrons of the second peak remain.

Figure 9:
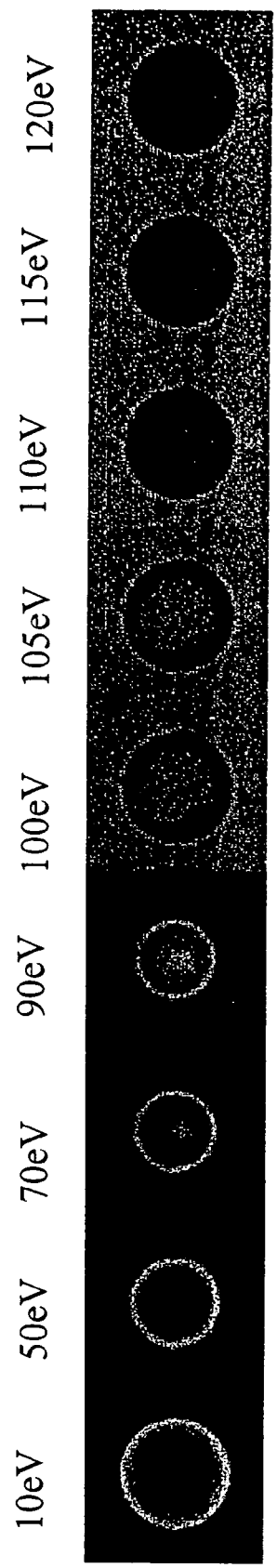
FIG. 9 is a series of simulated e-beam images of a blocked (contaminated) via under various energy filtering thresholds in accordance with an embodiment of the invention.

FIG. 9 is a series of simulated e-beam images of a blocked or contaminated via under various energy filtering thresholds in accordance with an embodiment of the invention. Like in FIG. 7, the text above each image indicates the energy threshold (referenced to beam energy) below which electrons were filtered out.

Like in FIG. 7, the simulation depicted in FIG. 9 assumed a potential energy differential between the bottom 206 of the via 202 and the top surface 204 surrounding the via 202 of one hundred electron volts (100 eV). However, contaminating material 302 is assumed to be near the bottom 206 of the via 202. In particular, the contaminating material is assumed to be insulating in nature.

As shown by the images in FIG. 9, as the threshold energy (relative to the beam energy) approaches the potential energy differential, scattered electrons from the bottom area of the via 202 become more prominent in the image data. However, in this case, since an insulating contaminant 302 is assumed at the bottom area, there is a greatly reduced intensity of scattered electrons being emitted from the bottom area due to the contaminant 302. For example, when the filtering threshold energy is at 100 eV, 105 eV, 110 eV, or more, then few scattered electrons are being detected from the bottom area. (The visible intensity at 100 eV and 105 eV is actually quite low such that a background intensity from the surface surrounding the feature is also visible.)

A comparison of FIG. 7 and FIG. 9 shows that the open and blocked vias can be readily distinguished when the filtering threshold energy is near the potential energy differential. For example, at the threshold energy of 110 eV, there is a relatively strong intensity coming from the bottom area of the via in FIG. 7 (indicating an open or clea via) while there is very little intensity coming from the bottom area of the via in FIG. 9 (indicating a blocked or contaminated via).

Figure 10:
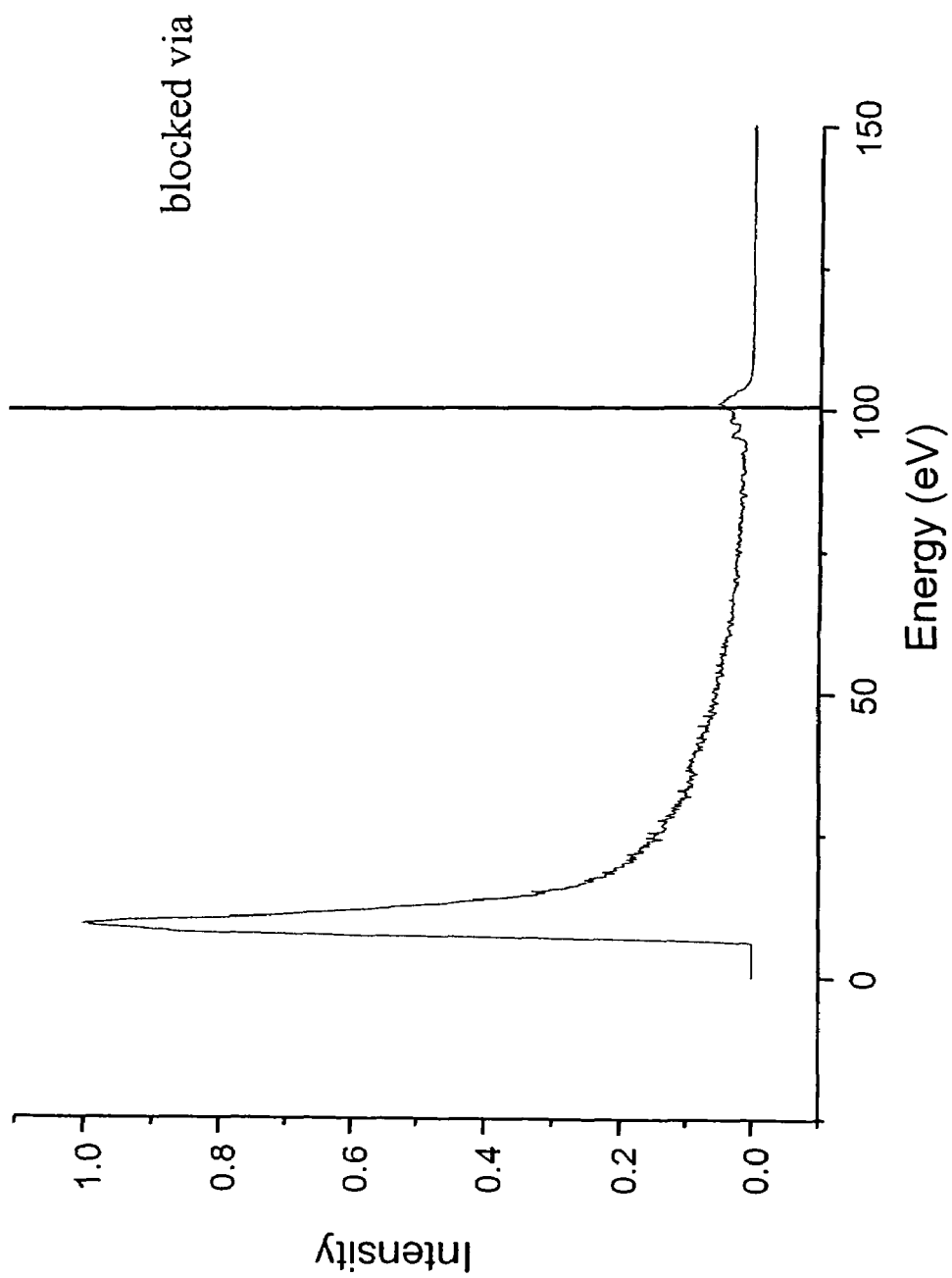
FIG. 10 is a graph depicting the simulated energy spectrum of scattered electrons from a blocked via in accordance with an embodiment of the invention.

FIG. 10 is a graph depicting the simulated energy spectrum of scattered electrons from a blocked or contaminated via in accordance with an embodiment of the invention. Like in FIG. 8, a normalized intensity of the scattered electrons is shown at various energies relative to the beam energy. Again, the higher peak on the left near zero electron volts (0 eV) is primarily attributed to secondary electrons being emitted from the top surface 204. However, in contrast to the spectrum of FIG. 8, the second peak (primarily attributed to secondary electrons from the bottom area of the via) is substantially reduced in intensity and less distinct. In addition, the second peak in FIG. 10 appears to be shifted to a lower energy than the second peak in FIG. 8. The vertical line at 100 eV is again indicative of the assumed energy differential of 100 eV from top to bottom of the via. As shown in FIG. 10, with an energy filtering threshold of around 110 eV, the electrons from the second peak become filtered out.

Figure 11:
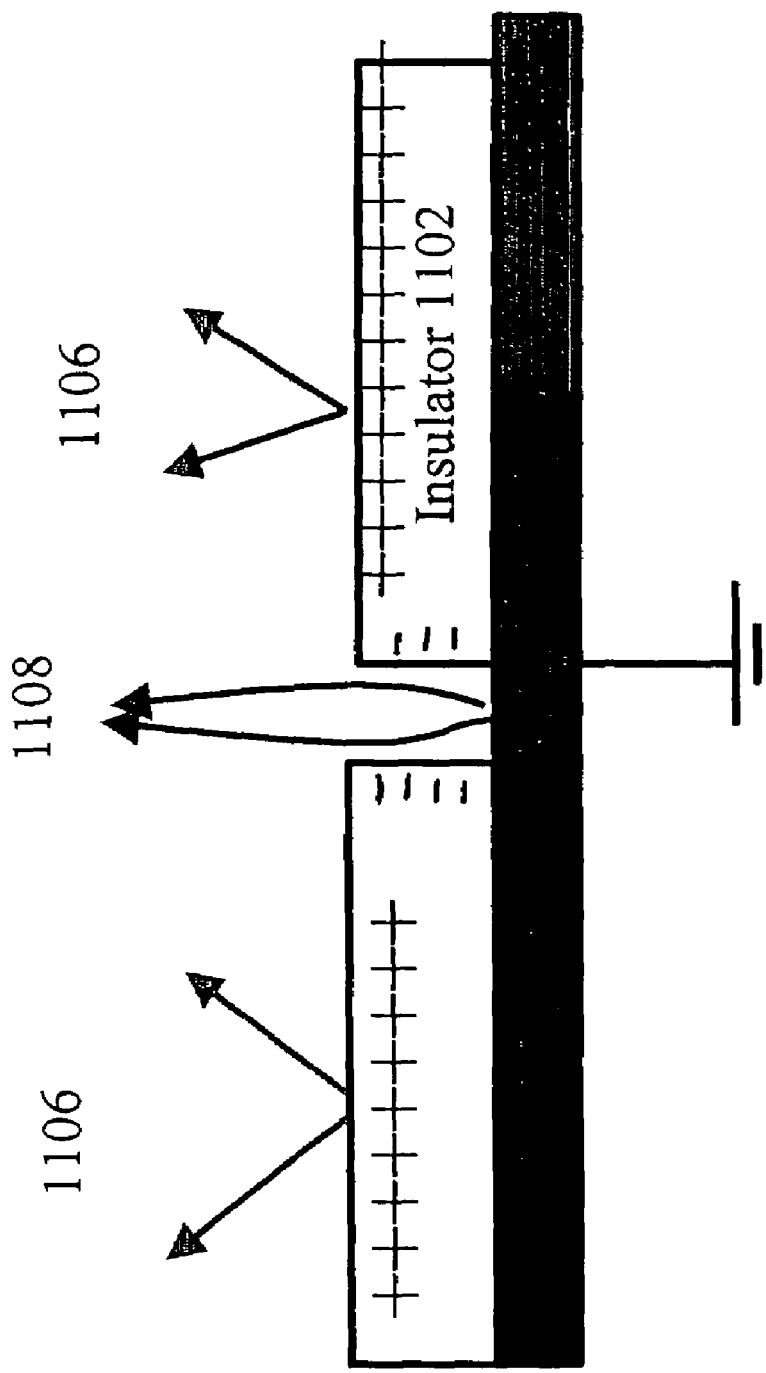
FIG. 11 is a diagram depicting scattered electrons being emitted from the top and bottom surfaces of a high aspect ratio feature in accordance with an embodiment of the invention.

FIG. 11 is a diagram depicting scattered electrons being emitted from the top and bottom surfaces of a high aspect ratio feature in accordance with an embodiment of the invention. The high aspect ratio feature includes an insulator layer 1102 on top of a conductor layer 1104. The insulator layer 1102 may be, for example, an oxide layer on a semiconductor wafer. As depicted, the insulator layer 1102 has a high aspect ratio channel or via (or similar such feature) that extends through the insulator layer 1102 and reaches the conductor layer 1104. The conductor layer 1104 may be, for example, a conductive polysilicon layer in a wafer. The conductor layer 1104 may be electrically grounded. Under bombardment from the incident beam, scattered electrons are emitted from the structure. Some of the scattered electrons 1106 are emitted from the insulator layer 1102, and other scattered electrons 1108 are emitted from the exposed portion of the conductor layer 1104. It is believed that due to the emission of secondary electrons, the top surface of the insulator 1102 become positively charged. The positive charge of the insulator surface creates a potential differential between the top of the insulator layer 1102 and the conductor layer 1104. Applicants believe that the sidewalls of the high aspect ratio feature becomes negatively charged. The negatively charged sidewalls repel the electrons leaving the bottom of the feature (from the exposed area of the conductor 1104. This creates a collimating effect where the sides of the features repel the electrons and the positively charged upper surface attracts and accelerates the electrons.

Electrons leaving the bottom of the high aspect ratio feature therefore will have a different energy as they travel up the "column" of the feature than will electrons leaving the positively charged upper surface of the specimen. In fact, applicants believe that the electrons can be separated based upon the energy into two distinct groups, those from the bottoms of the high aspect ratio features, and those from the upper surface or feature edges (sidewalls). Alternatively, the electrons can be separated based upon angle, such that the electrons from the sidewalls, believed to be emitted at angles less perpendicular to the surface, are filtered out. By filtering the electrons, an image of only the bottom of the features can thus be created. This is very useful and advantageous in inspecting or reviewing high aspect ratio features.

Figure 12:
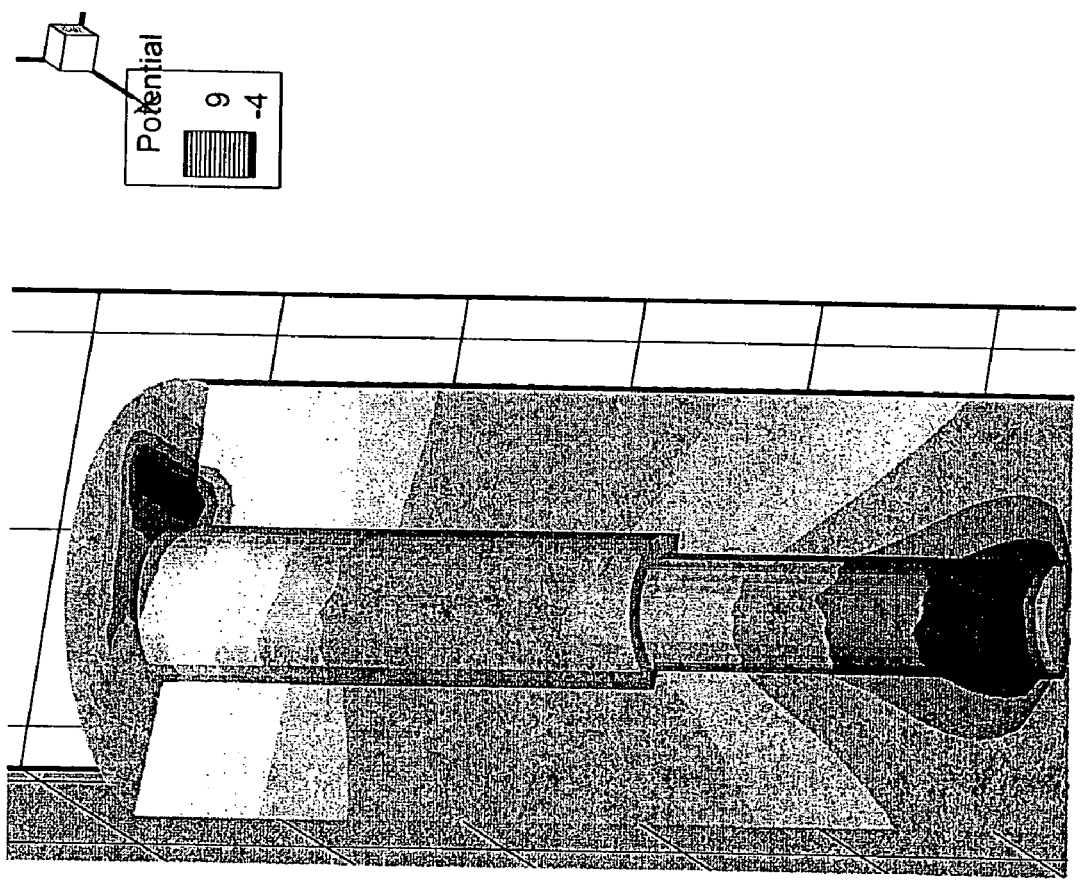
FIG. 12 is an illustrative diagram showing potential contours of a high aspect ratio feature on a wafer under bombardment from an incident beam.

FIG. 12 is an illustrative diagram showing potential contours of a high aspect ratio feature on a wafer under bombardment from an incident beam. The calculated contours show that, under bombardment from the incident beam, the electrical potential is most negative near the bottom of the via and increases until the top of the via is reached. Hence, the negatively charged electrons leaving the bottom of the via lose potential energy in traveling up the "column" to the top surface of the wafer. The decrease in potential energy results in a corresponding increase in kinetic energy. Thus, electrons extracted from the bottom of the via have higher energies than electrons extracted directly from the top surface of the wafer.

Figure 13:
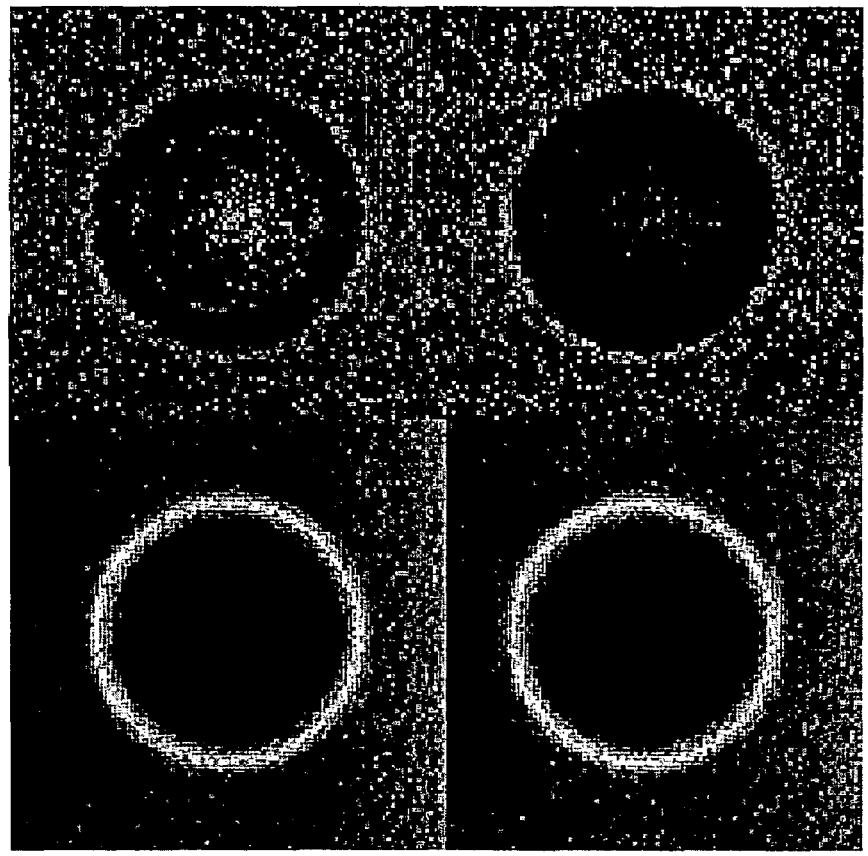
FIG. 13 depicts the advantageous improvement in examination of the bottom of high aspect ratio features when filtering is used in accordance with an embodiment of the invention.

FIG. 13 depicts the advantageous improvement in examination of the bottom of high aspect ratio features when filtering is used in accordance with an embodiment of the invention. The image data presented was calculated using a detailed simulation. The left column presents the conventional unfiltered images from an open via (upper left) and from a blocked via (lower left). Due to the dominance of the high intensity of electrons detected from the sidewalls of the high aspect ratio feature, these images appear to be similar to each other. Hence, in practice, it is difficult to definitively identify blocked vias from such image data. In contrast, the right column presents the energy filtered images from an open via (upper right) and from a blocked via (lower right). As can be seen in the images, the electrons detected from the sidewalls of the high aspect ratio feature no longer overwhelm the images. Thus, it is substantially easier to see the electrons detected from the bottom of the feature. This enables an automated inspection or review system (or a person viewing the image) to identify blocked vias. For example, the blocked vias may be identified by the lack of intensity from the bottom of a blocked feature, in contrast to the substantial intensity from the bottom of an open feature.

FIG. 14 shows simulated and experimentally measured images of a high aspect ratio feature. The simulated image (on the left) was calculated assuming an electrical potential differential of twenty volts (20 V) between the top and bottom of the feature. These images are presented to indicate the general accuracy of the above-described simulations. For example, the experimental image (on the right) confirms the presence of a ring of intensity from the sidewalls of the feature. Furthermore, applying energy filtering in obtaining the experimental data (filtered data not illustrated) confirms that the energies of electrons coming from the bottom of the feature are generally higher (more than 10 eV above the beam energy) than the energy of electrons coming from the sidewalls of the feature (less than 10 eV above the beam energy).

In an alternate embodiment of the invention, an adjustable extraction or retarding field may effectively apply the energy filtering, instead of a filter at the detector. For example, by reducing the strength of the extracting field, or by increasing the strength of a retarding field, lower energy secondary electrons can be effectively filtered out or suppressed because they are no longer extracted. Hence, an apparatus in accordance with an embodiment of the invention may utilize a means for adjusting the extraction or retarding field in order to effectively implement the filtering. In one specific embodiment, the means for adjusting may be electrostatic in implementation. In another specific embodiment, the means for adjusting may be magnetic in implementation.

An embodiment of the invention may utilize the filtering for depth profiling of high aspect ratio features. For example, metrology in the vertical dimension may be achieved by varying the selected energy range of an energy filter to obtain a series of image data showing electrons from different vertical levels down the hole. As the selected energy range is moved gradually higher, the visible portion of the feature should move gradually vertically down the feature.

In another variation of the invention, a detector may be located in the pupil plane. The angular filtering may in effect be implemented by such location of the detector. In one implementation, the detector may be a charge coupled device (CCD) detection array. Such a detector may be utilized, for example, to observe scratches on a flat wafer.

The above description illustrates the positive results obtained when, for example, high-pass filtering of electron energies is used to improve the inspection or review of high aspect ratio features on semiconductors. The following description discusses an embodiment of the invention to implement band-pass filtering of electron energies. Such band-pass filtering may be applied to further advantage in the inspection or review of semiconductor wafers. For example, the band-pass filtered imaging maybe used to even better isolate the electrons emitting from the bottom of a via to determine if the via is clean or contaminated.

Figure 15:
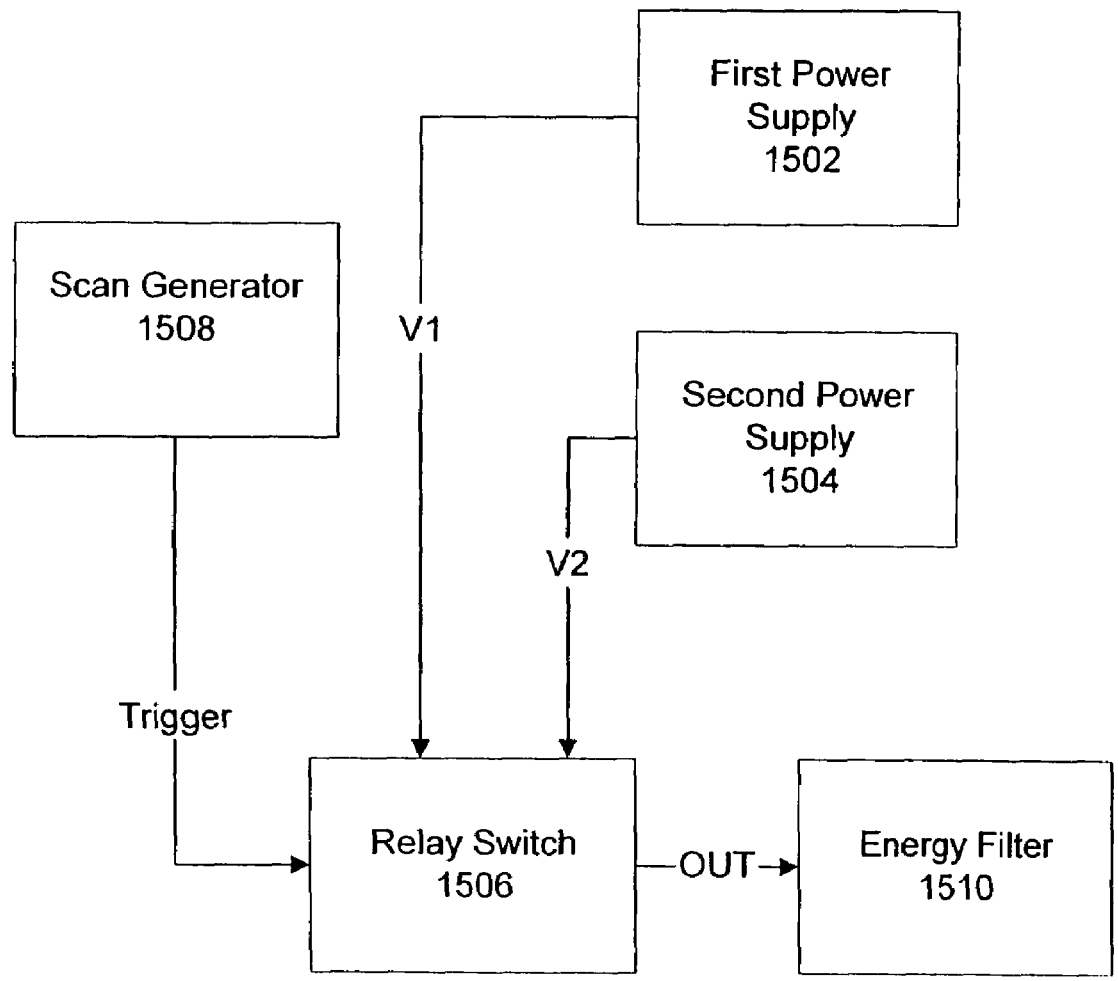
FIG. 15 depicts a system for supplying voltages to be used in accomplishing band-pass energy filtered inspection or review in accordance with an embodiment of the invention.

FIG. 15 depicts a system 1500 for generating voltages to be used in accomplishing band-pass energy filtered inspection or review in accordance with an embodiment of the invention. The system 1500 as depicted includes a first power supply 1502, a second power supply 1504, a relay switch 1506, a scan generator 1508, and an energy filter 1510.

The first power supply 1502 is configured to supply a first DC voltage V1, and the second power supply 1504 is configured to supply a second DC voltage V2. The relay switch 1506 receives V1 and V2 as input voltages, and outputs one of them to the energy filter device 1510. The energy filter device 1510 may comprise a high-pass filter that prevents electrons below a threshold energy from being detected. The timing of when V1 or V2 is output depends on a trigger signal provided to the relay switch 1506 by the scan generator 1508. The trigger signal for one embodiment of the invention is frame synchronized and is described below in relation to FIG. 16.

Figure 16:
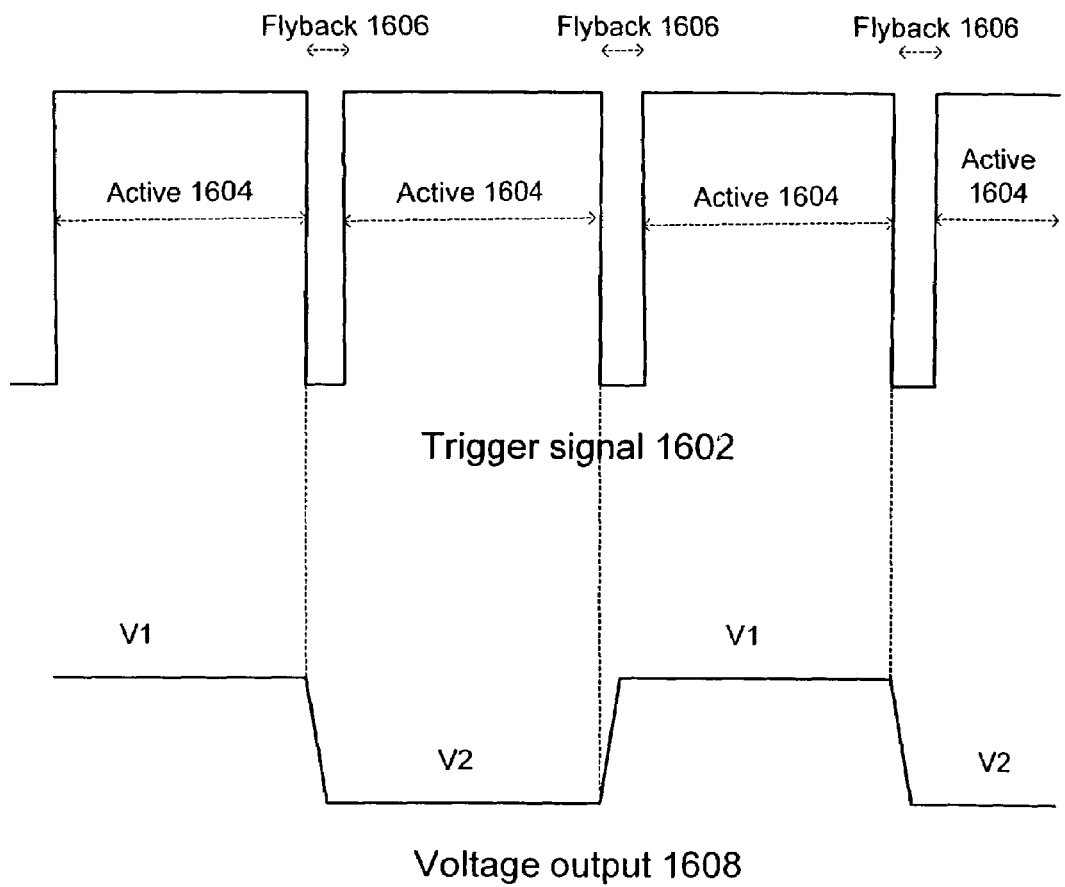
FIG. 16 depicts a timing diagram for implementing band-pass energy filtering in accordance with an embodiment of the invention.

FIG. 16 depicts a timing diagram for implementing band-pass energy filtering in accordance with an embodiment of the invention. The upper diagram represents an example of a trigger signal 1602, and the lower diagram represents an example of a voltage output signal 1608. In both upper and lower diagrams, the horizontal axis represents time. The vertical axis represents signal strength in the upper diagram and voltage in the lower diagram.

In accordance with an embodiment of the invention, the trigger signal 1602 comprises a timing signal correlated to the frame capture timing. As illustrated, the signal 1602 may include an active portion 1604 during which raster scanning is performed to capture a frame and a flyback portion 1606 which is a vertical blanking interval during which the beam "flies" back from one corner to another corner prior to beginning the next frame. A feature of the trigger signal 1602 is used to trigger the transition between voltage V1 and voltage V2 in the output signal 1608. In the particular case illustrated, the falling edge between an active portion 1604 and a flyback portion 1606 is used to trigger the transition. Using the falling edge, instead of the rising edge, is advantageous in that the voltage output 1608 has time to transition and stabilize prior to the active capture of the next frame.

Hence, in accordance with the timing diagram of FIG. 16, V1 and V2 are applied to the high-pass energy filter for alternate frames. In other words, V1 is applied for one frame; V2 for the next frame; then V1; then V2; and so on. Each frame with V1 applied is formed from electrons with energies above a first threshold that is determined by V1. Similarly, each frame with V2 applied is formed from electrons with energies above a first threshold that is determined by V2.

Data from each pair of adjacent frames (one with V1 applied and another with V2 applied) may be combined to create a band-pass image frame. The band-pass image frame is effectively formed by detected electrons with energies between the first threshold (determined by V1) and the second threshold (determined by V2). The band-pass frames are formed at half the rate of capture as the original frames. For example, if the original frames are captured at a rate of 30 Hertz, then the band-pass image frames are formed at a rate of 15 Hertz.

Prior to combining the data from the adjacent frames, various data processing steps may be optionally applied. One such optional step is normalization of the image contrast. After the band-pass image frames are created, they may be processed and analyzed to inspect for defects or to review defects therein.

Figure 17:
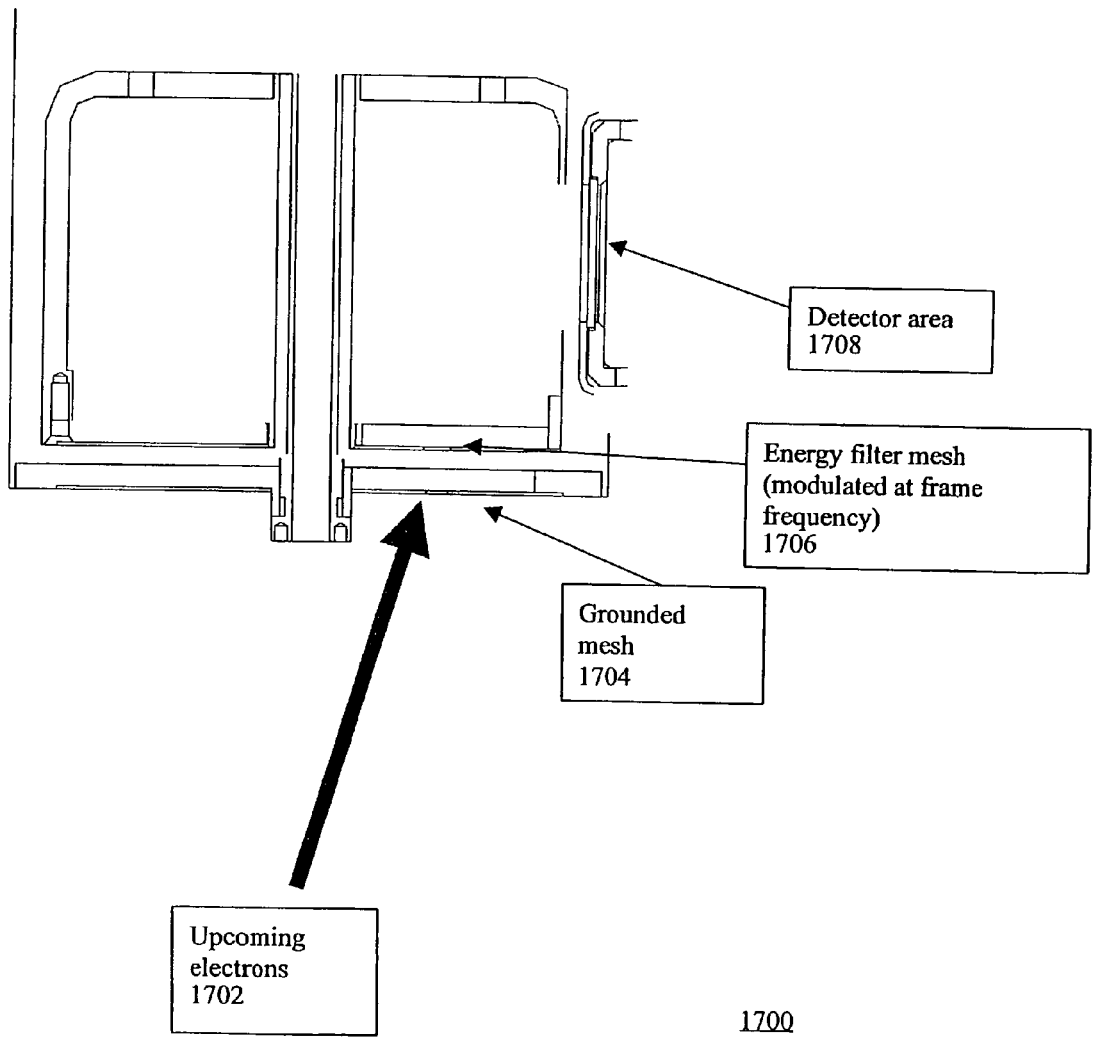
FIG. 17 is a cross-section of an electron detector that may be used to implement the band-pass energy filtering in accordance with an embodiment of the invention.

FIG. 17 is a cross-section of an electron detector 1700 that may be used to implement the band-pass energy filtering in accordance with an embodiment of the invention. Upcoming electrons 1702 (secondary or backscattered) approach the detector after being emitted from the specimen. The electrons 1702 first go through a first metallic mesh 1704. This mesh 1704 is electrically grounded. The grounded mesh 1704 shields the detector from electrons in the primary (incident) beam. Subsequently, the upcoming electrons 1702 approach the energy filter mesh 1706. As described above, the voltage applied to this mesh 1706 may be modulated with alternating voltage levels at the frame frequency. The filter mesh 1706 acts as a high-pass filter, where the voltage level on the filter mesh 1706 determines the threshold energy needed for electrons to pass through the filter mesh 1706. The mesh 1706 repulses those electrons with insufficient energies. Those electrons with sufficiently high energies pass through the filter mesh 1706 and detected by the detector area 1708.

Figure 18:
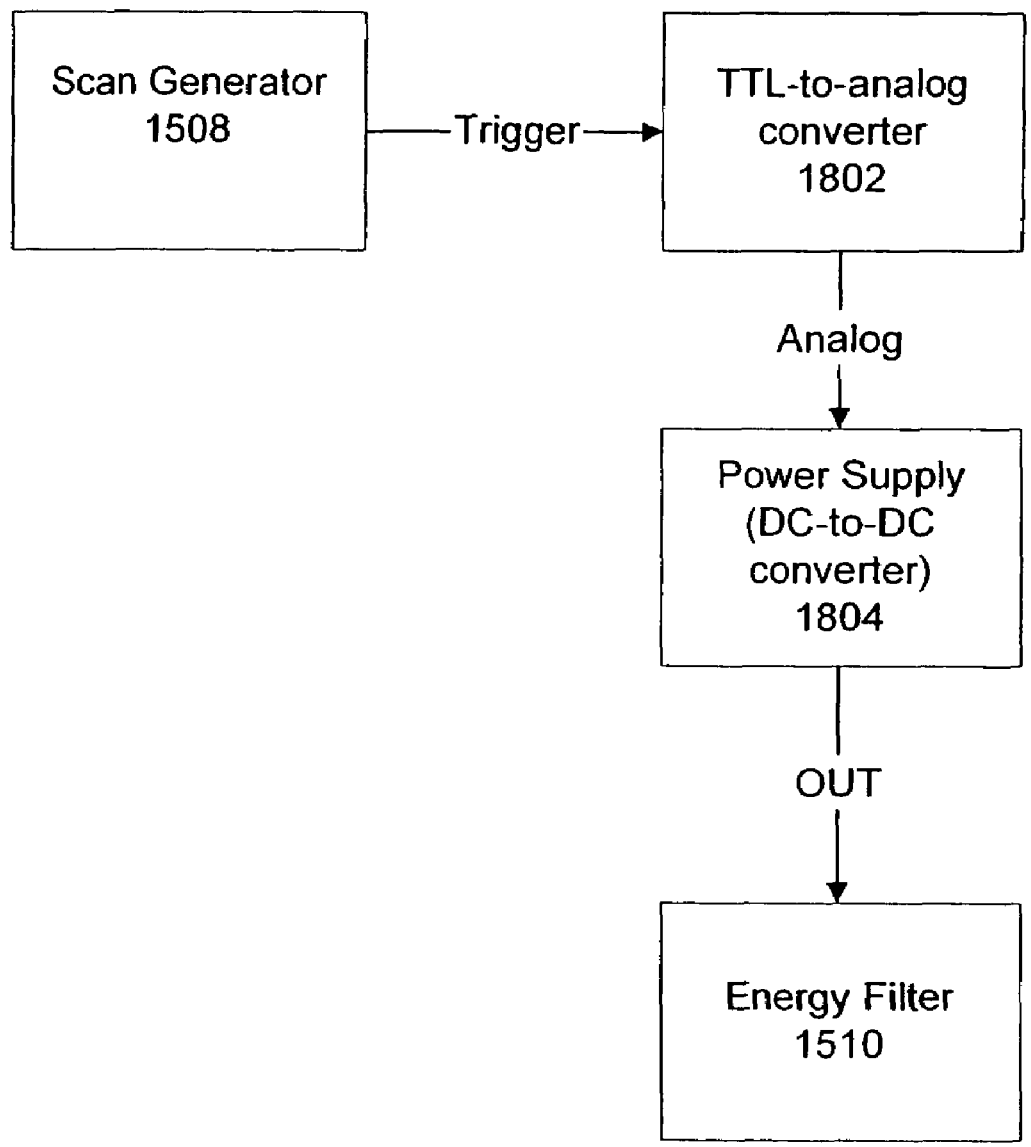
FIG. 18 depicts an alternate system for generating voltages to be used in accomplishing band-pass filtering in accordance with an embodiment of the invention.

FIG. 18 depicts an alternate system 1800 for generating voltages to be used in accomplishing band-pass filtering in accordance with an embodiment of the invention. The system 1800 includes a scan generator 1508, a TTL-to-analog converter 1802, a variable power supply 1804, and an energy filter 1510.

The scan generator 1508 may generate a trigger signal, for example, such as the one described in relation to FIG. 16. The trigger signal is received by the TTL-to-analog converter 1802. (TTL is a conventionally understood term that refers to transistor-to-transistor logic levels that use a +5 supply voltage. The trigger signal may not necessarily be in TTL form per se. Rather, the term is being used herein to refer to any similar digital logic signal.) The converter 1802 takes the digital trigger signal and outputs an analog control signal. The analog control signal indicates the voltage level that the variable power supply 1804 is to output to the energy filter device 1510. The analog signal should be at a first level such that V1 is output during the capture of a first frame, and it should be at a second level such that V2 is output during the capture of a next frame. The analog signal should go on to alternate between the first and second levels at the frame capture frequency. In this way, V1 is applied for one frame; V2 for the next frame; then V1; then V2; and so on.

In an alternate embodiment, the variable power supply 1804 may be digitally controlled (instead of being controlled by an analog signal). In that case, the trigger signal would control a digital input into the power supply unit 1804.

Figure 19:
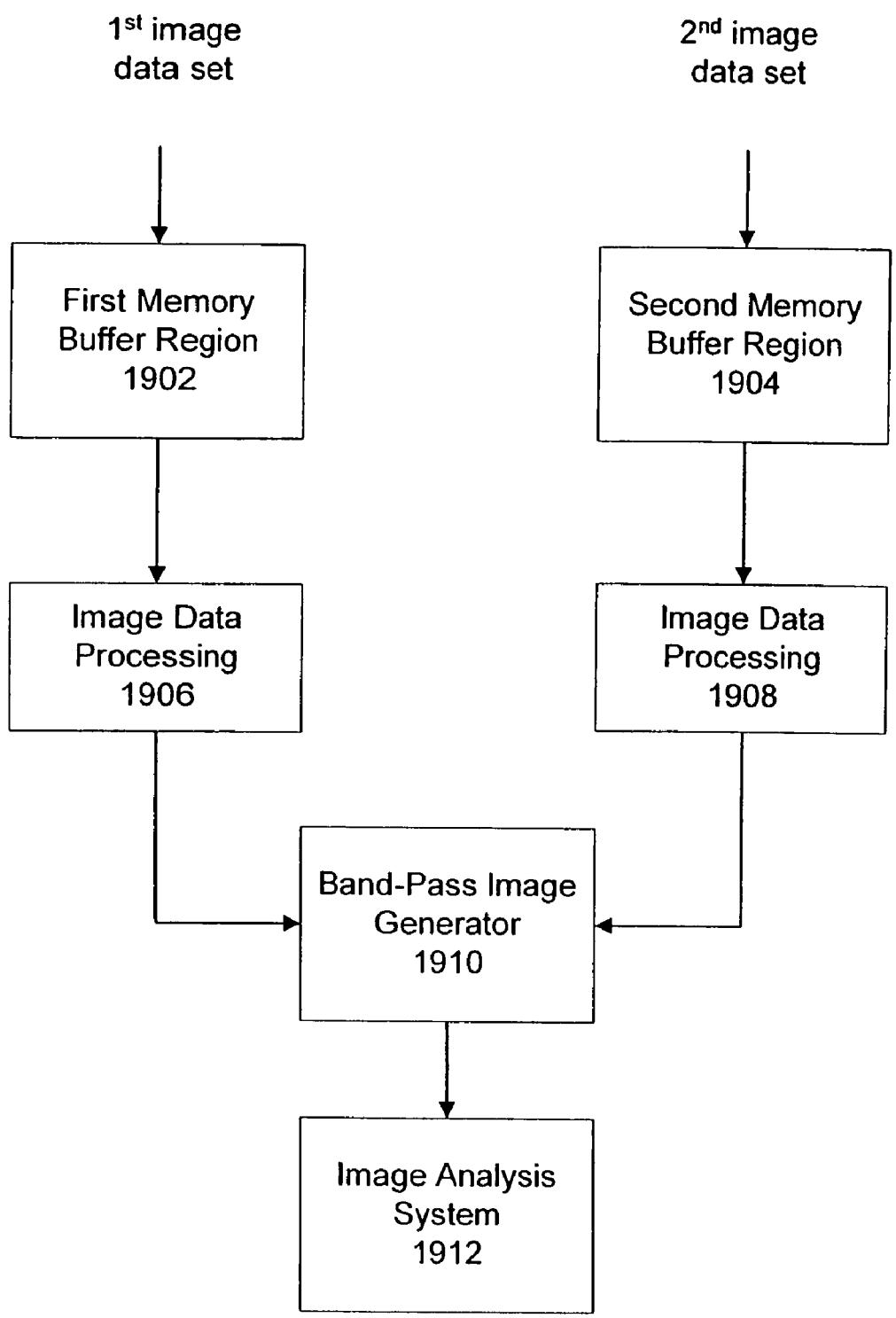
FIG. 19 depicts a system for processing high-pass energy filtered image data sets in accordance with an embodiment of the invention.

FIG. 19 depicts a system for processing high-pass energy filtered image data sets in accordance with an embodiment of the invention. The system includes a first memory buffer region 1902, a second memory buffer region 1904, image data processors 1906 and 1908, a band-pass image generator 1910, and an image analysis system 1912.

The first and second memory buffer regions 1902 and 1904 may be different regions of a singular memory buffer, or alternatively, may be separate memory buffers. In one embodiment, the memory buffers may be implemented using static random access memory (SRAM) components. The first image data set is received by and stored in the first memory buffer region 1902, and the second image data set is received by and stored in the second memory buffer region 1904. In accordance with an embodiment of the invention, the first image data set corresponds to an image formed by electrons with energies above the first threshold energy level, and the second image data set corresponds to an image formed by electrons with energies above the second threshold energy level. Optionally, the image data sets may then be processed by image data processors 1906 and 1908 (which in some embodiments may comprise a single processor that operates on both data sets). For instance, the image data processing may be performed to normalize the contrast in the image data sets in a manner like that described below in relation to FIG. 20. The band-pass image generator 1912 is configured to generate a band-pass image data set by subtraction of the second image data set from the first image data set, or vice versa.

Figure 20:
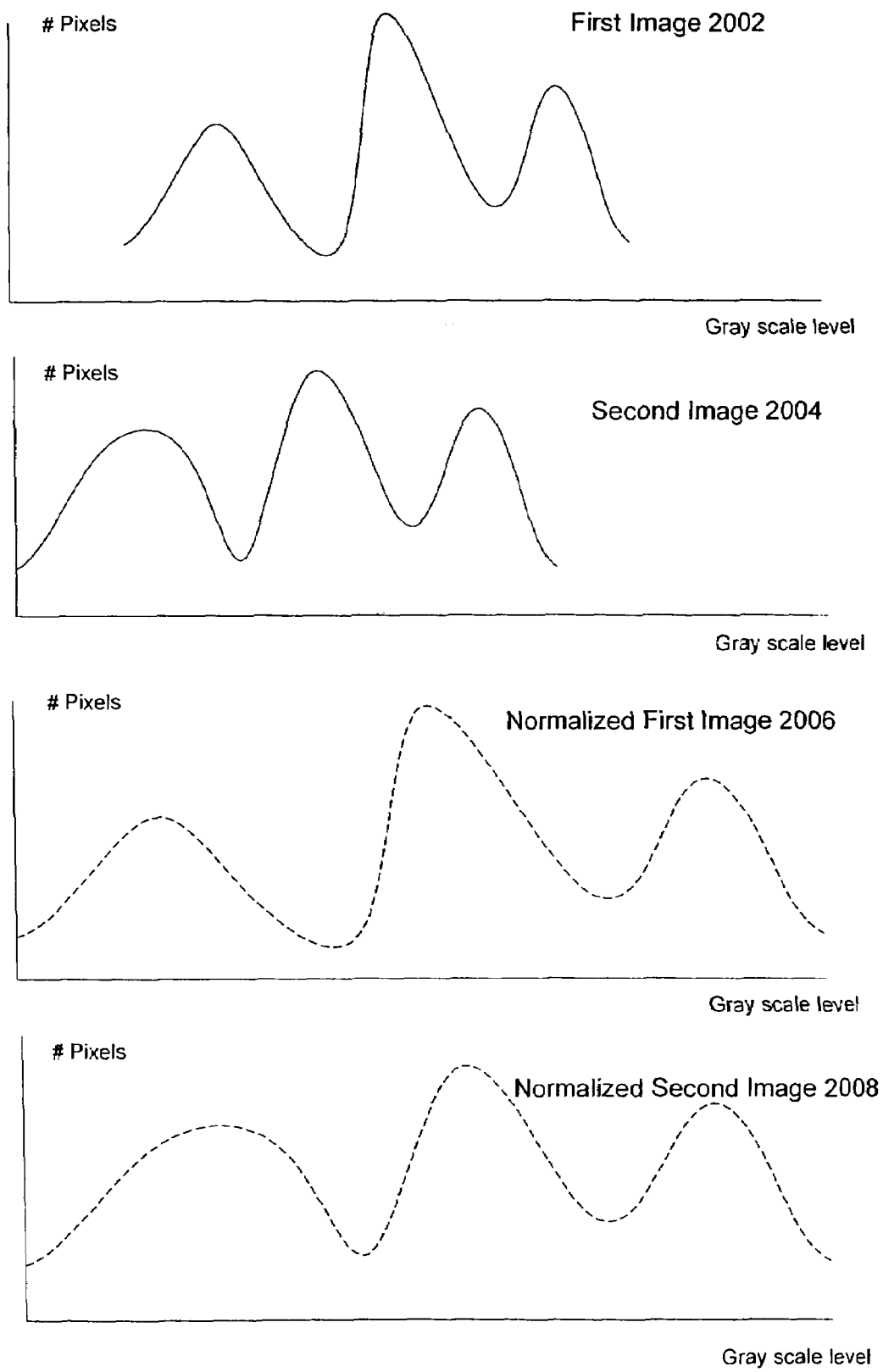
FIG. 20 is an illustration of an example normalization procedure in accordance with an embodiment of the invention.

FIG. 20 is an illustration of an example normalization procedure in accordance with an embodiment of the invention. The graphs in FIG. 20 are basically histograms showing the number of pixels at an intensity (gray scale) level in each image. The top graph 2002 shows a hypothetical histogram of a first image data set, while the second graph 2004 shows a hypothetical histogram of a second image data set. In the hypothetical example shown, the pixels of the first image data set span a different range of gray scale levels than do the pixels of the second image data set. In accordance with one embodiment of the invention, a processing step may be applied to both the first and second image data sets 2004 to normalize the contrast. In effect, the processing step "stretches" each histogram to a common base by changing the mapping of detected intensity values to gray scale levels. The third and fourth graph 2006 and 2008 illustrate normalized versions of the histograms after such processing has been applied. This advantageously enhances and equalizes the contrast levels in the two image data sets.

The above-described diagrams are not necessarily to scale and are intended be illustrative and not limiting to a particular implementation. The above-described invention may be used in an automatic inspection or review system and applied to the inspection or review of wafers, optical masks, X-ray masks, electron-beam-proximity masks and stencil masks and similar substrates in a production environment.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method for examining a specimen with a high aspect ratio feature, the method comprising:
    impinging a primary beam onto an area of the specimen with the high aspect ratio feature;
    extracting scattered electrons that are generated due to the impingement of the primary beam onto the specimen;
    applying a filter to remove the scattered electrons with characteristics outside of a selected filter range; and
    detecting the scattered electrons with characteristics inside of the selected filter range to generate image data relating to the high aspect ratio feature,
    wherein the filter comprises an energy filter, wherein the filter range comprises an energy range, and wherein applying the energy filter removes the scattered electrons with energies outside the energy range, and
    wherein the energy range comprises energies below a threshold energy, and wherein the threshold energy is set to an approximate potential difference from a bottom of the high aspect ratio feature to a surface of the area surrounding the feature.

2. The method of claim 1, wherein the filter further comprises an angular filter, wherein the filter range comprises an angular range, and wherein applying the angular filter removes the scattered electrons with angles outside the angular range.

3. The method of claim 2, wherein the angular filter comprises an aperture in a pupil plane.

4. The method of claim 1, wherein a large portion of the unfiltered scattered electrons generated from the high aspect ratio feature are generated from sidewalls of the feature.

5. The method of claim 4, wherein the filter removes a majority of the scattered electrons generated from the sidewalls of the high aspect ratio feature.

6. The method of claim 1, wherein the method further comprises moving a stage holding a series of specimens for high throughput in-line inspection of the specimens.

7. The method of claim 1, further comprising processing the image data for automated examination of the specimen.

8. The method of claim 7, wherein the processing includes comparing data from a die being inspected with reference data to identify high aspect ratio defects.

9. The method of claim 8, further comprising recording identified high aspect ratio defects in a database.

10. The method of claim 7, wherein the processing includes analysis to classify identified high aspect ratio defects.

11. The method of claim 10, wherein the analysis comprises rule-based analysis.

12. The method of claim 1, further comprising impinging an auxiliary beam to control the charging of the specimen.

13. The method of claim 12, wherein the auxiliary beam comprises a second electron beam.

14. The method of claim 1 further comprising varying the selected energy range to achieve depth profiling of the high aspect ratio feature.

15. An apparatus for examining a specimen including a high aspect ratio feature, the apparatus comprising:
    a source and lenses for impinging a primary beam onto an area of the specimen;
    an extraction mechanism for extracting scattered electrons that are generated due to the impingement of the primary beam onto the specimen;
    a filter for filtering out the scattered electrons with characteristics outside of a selected filter range;
    a detector for detecting the scattered electrons with characteristics inside of the selected filter range to generate image data relating to the area of the specimen; and
    a computing device for processing the image data in relation to the high aspect ratio features,
    wherein the filter comprises an energy filter, wherein the filter range comprises an energy range, and wherein applying the energy filter removes the scattered electrons with energies outside the energy range, and
    wherein the energy range comprises energies below a threshold energy, and wherein the threshold energy is set to an approximate potential difference from a bottom of the high aspect ratio feature to a surface of the area surrounding the feature.

16. The apparatus of claim 15, wherein the apparatus comprises an inspection tool that is capable of detecting defects relating to the high aspect ratio features in specimens being manufactured.

17. The apparatus of claim 15, wherein the apparatus comprises a review tool that is capable of defects to the high aspect ratio features in specimens being manufactured.

18. The apparatus of claim 15, wherein the apparatus comprises a critical dimension scanning electron microscope that is capable of measuring dimensions of the high aspect ratio features.

19. The apparatus of claim 15, wherein the source comprises an electron source, and wherein the primary beam comprises a primary electron beam.

20. The apparatus of claim 19, wherein the primary electron beam comprises a low-energy electron beam, and wherein the apparatus comprises a low-energy electron microscope.

21. The apparatus of claim 15, wherein the primary beam comprises a photon beam, and wherein the apparatus comprises a photo-emission electron microscope.

22. The apparatus of claim 15, wherein the filter comprises a device from a group of devices consisting of an electrostatic grid, an omega filter, and a Wien filter.

23. The apparatus of claim 15, wherein the filter as implemented further comprises an angular filter for selecting electrons emitted approximately perpendicular to the specimen's surface.

24. The apparatus of claim 23, wherein the angular filter comprises an aperture located in a pupil plane of the apparatus.

25. The apparatus of claim 15, wherein the detector is located in a pupil plane of the apparatus so as to implement the filter by said location of detector.

* * * * *